(12) United States Patent
Miller et al.

(10) Patent No.: US 8,399,360 B1
(45) Date of Patent: Mar. 19, 2013

(54) PROCESS FOR POST CONTACT-ETCH CLEAN

(75) Inventors: Sheri Miller, Cannon Falls, MN (US); Vinay Krishna, Apple Valley, MN (US); Sriram Viswanathan, Chanhassen, MN (US)

(73) Assignee: Cypress Semiconductor Corporation, San Jose ( * ) Notice: Subject to any disclaimer, the term of this patent is extended or adjusted under 35 U.S.C. 154(b) by 1642 days.

(21) Appl. No.: 11/599,926

(22) Filed: Nov. 14, 2006

Related U.S. Application Data

(60) Provisional application No. 60/737,502, filed on Nov. 17, 2005.

(51) Int. Cl.
*H01L 21/302* (2006.01)
*H01L 21/4763* (2006.01)

(52) U.S. Cl. .................. 438/710; 438/622; 438/629

(58) Field of Classification Search .................. 438/622, 438/629, 710
See application file for complete search history.

(56) References Cited

U.S. PATENT DOCUMENTS

| | | | |
|---|---|---|---|
| 5,306,671 A | 4/1994 | Ogawa et al. | |
| 5,468,342 A | 11/1995 | Nulty et al. | |
| 5,523,258 A | 6/1996 | Petti et al. | |
| 5,562,801 A | 10/1996 | Nulty | |
| 5,670,426 A | 9/1997 | Kuo et al. | |
| 5,779,925 A | 7/1998 | Hashimoto et al. | |
| 5,817,579 A | 10/1998 | Ko et al. | |
| 5,824,234 A | 10/1998 | Jou et al. | |
| 5,861,676 A | 1/1999 | Yen | |
| 5,908,319 A * | 6/1999 | Xu et al. | 438/725 |
| 5,920,796 A | 7/1999 | Wang et al. | |
| 5,953,614 A | 9/1999 | Liu et al. | |
| 5,968,279 A | 10/1999 | MacLeish et al. | |
| 5,968,846 A | 10/1999 | Chou et al. | |
| 6,004,874 A | 12/1999 | Cleeves | |
| 6,022,805 A | 2/2000 | Sumi | |
| 6,066,555 A | 5/2000 | Nulty et al. | |
| 6,235,640 B1 | 5/2001 | Ebel et al. | |
| 6,277,733 B1 | 8/2001 | Smith | |
| 6,451,703 B1 | 9/2002 | Liu et al. | |
| 6,554,004 B1 * | 4/2003 | Nguyen et al. | 134/1.3 |
| 6,638,855 B1 * | 10/2003 | Chang et al. | 438/637 |
| 6,756,315 B1 | 6/2004 | Bamnolker et al. | |
| 6,905,965 B2 * | 6/2005 | Subrahmanyan et al. | 438/687 |
| 7,111,629 B2 * | 9/2006 | Kim et al. | 134/1.2 |
| 7,390,755 B1 * | 6/2008 | Chen et al. | 438/749 |
| 7,737,005 B2 * | 6/2010 | Tada et al. | 438/477 |
| 2004/0072440 A1 * | 4/2004 | Kim et al. | 438/709 |
| 2005/0106888 A1 * | 5/2005 | Chiu et al. | 438/710 |
| 2005/0181588 A1 * | 8/2005 | Kim | 438/586 |
| 2006/0102197 A1 * | 5/2006 | Chiang et al. | 134/1.2 |
| 2006/0252256 A1 * | 11/2006 | Weng et al. | 438/637 |

OTHER PUBLICATIONS

USPTO Notice of Allowance for U.S. Appl. No. 09/672,836 dated Nov. 10, 2003; 4 pages.
USPTO Final Rejection for U.S. Appl. No. 09/672,836 dated Jun. 19, 2003; 11 pages.
USPTO Non-Final Rejection for U.S. Appl. No. 09/672,836 dated Dec. 31, 2002; 8 pages.

(Continued)

*Primary Examiner* — James Mitchell

(57) ABSTRACT

A method is provided for cleaning a semiconductor topography having one or more contact openings etched through a dielectric layer formed on a substrate. The method substantially eliminates unfilled contacts and reduces contact defects. Generally, the method involves: (i) heating the substrate in a processing chamber to a predetermined temperature; (ii) generating a plasma upstream of the process chamber using a microwave generator and a process gas comprising nitrogen and hydrogen or argon and helium; and (iii) introducing the plasma into the process chamber to clean the semiconductor topography. As the clean is accomplished substantially without the use of an organic solvent, galvanic corrosion of contacts subsequently formed in the contact openings is substantially eliminated. Other embodiments are also described.

13 Claims, 4 Drawing Sheets

OTHER PUBLICATIONS

USPTO Final Rejection for U.S. Appl. No. 09/672,836 dated May 21, 2002; 10 pages.

USPTO Non-Final Rejection for U.S. Appl. No. 09/672,836 dated Aug. 29, 2001; 12 pages.

* cited by examiner

PROCESS FOR POST CONTACT-ETCH CLEAN

CROSS-REFERENCE TO RELATED APPLICATIONS

The present application claims the benefit of priority under 35 U.S.C. 119(e) to U.S. Provisional Patent Application Ser. No. 60/737,502 filed Nov. 17, 2005, entitled Process For Post Contact-Etch Clean, which application is hereby incorporated by reference.

TECHNICAL FIELD

This invention relates to semiconductor processing and, more particularly, to methods for processing a semiconductor topography having openings etched within a dielectric layer.

BACKGROUND OF THE INVENTION

In the fabrication of semiconductor devices, numerous conductive structures, such as gate electrodes, contacts, vias and interconnects, may be formed in or above a substrate, and isolated from one another by one or more dielectric layers. It is often necessary to form openings through the dielectric layers to allow for contact to underlying regions or layers. Generally, an opening through a dielectric layer exposing a diffusion region of a semiconductor substrate or between a gate electrode and a first metal layer are referred to as a "contact opening" or a "contact hole." An opening through an interlevel dielectric layer is referred to as a "via" or a "via opening." For purposes of this disclosure, however, "contact opening" may be used to refer to an opening for a contact or via.

After a contact opening has been formed through a dielectric layer, the opening may be cleaned to remove small amounts of debris and residual material formed on surfaces of the contact opening during the contact-etch and to remove a photoresist mask on the surface of the substrate used to pattern the opening.

Conventional post contact-etch clean includes a low temperature dry ash followed by an nitrogen-trifluoride ($NF_3$)/$H_2$ plasma followed by a solvent strip using an organic solvent, such as EKC®-265. The solvent strip is necessary to remove $NF_3$/$H_2$ salts or residue left by the dry clean process. FIG. 1 is a diagram illustrating an electron microscope image of a semiconductor topography formed on a substrate 100 and showing ash residue 102 left in contact openings 104 cleaned according to a conventional method. As seen from this figure, even with the extra solvent strip sub-step, the conventional method is not wholly satisfactory at removing residue left by the dry clean process. In addition to the added cost and the increased cycle or fabrication time of the solvent strip sub-step, the organic solvent leaves residues that cause galvanic corrosion in the contacts leading to unfilled contacts, causing line yield and/or die yield loss. Galvanic corrosion leading to unfilled contacts is particularly a problem with Tungsten (W) contacts. FIG. 2 is a diagram illustrating an electron microscope image of a cross-sectional view of a semiconductor topography formed on a substrate 200, cleaned according to a conventional method, and having an unfilled contact 202. Additional structures shown in the diagram of FIG. 2 include a contact 204 extending from a surface of the substrate to a local interconnect (LI 206), and underlying contacts 208 extending from the LI to underlying elements, regions or contacts (not shown).

Accordingly, there is a need for a post-contact etch clean or cleaning method for cleaning contact openings that substantially eliminates unfilled contacts, thereby significantly improving yield. It is further desirable that the post-contact etch clean reduces processing costs and improves cycle time.

The present invention provides a solution to these and other problems, and offers further advantages over conventional post contact etch cleans.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

Figure 1:
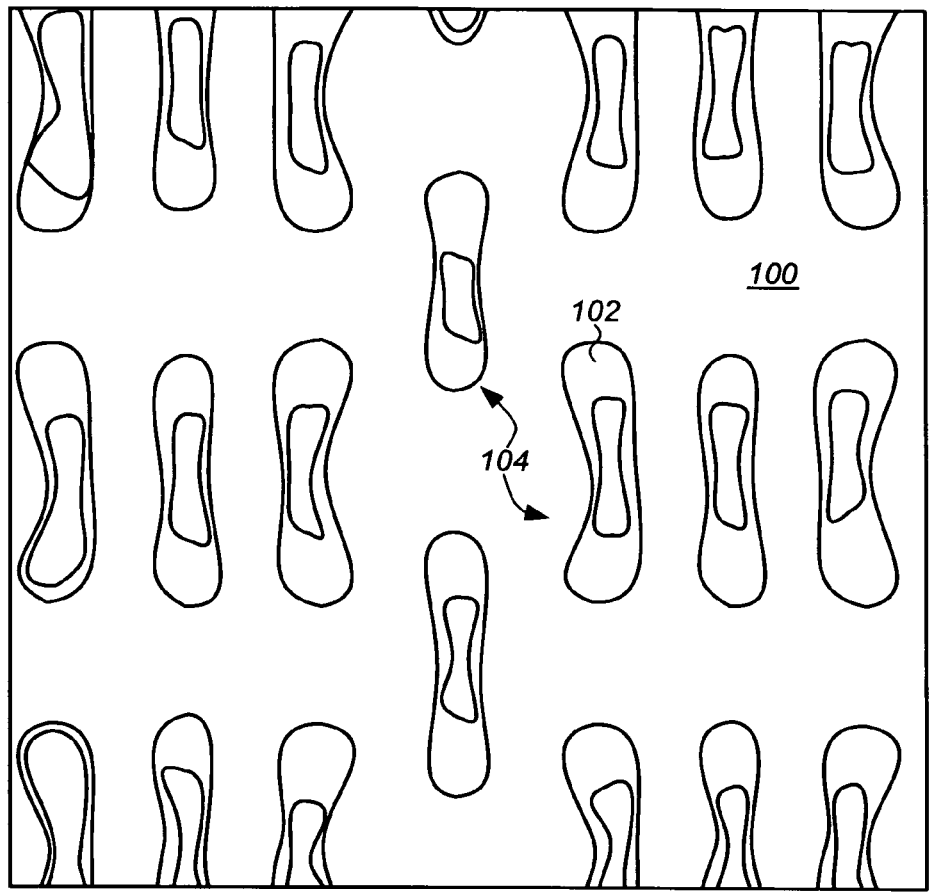
FIG. 1 (Prior Art) is a diagram illustrating an electron microscope image of a planar top view of contact openings in a semiconductor topography cleaned according to a conventional method showing dry clean residue in contact openings following a post contact-etch clean.
Figure 2:
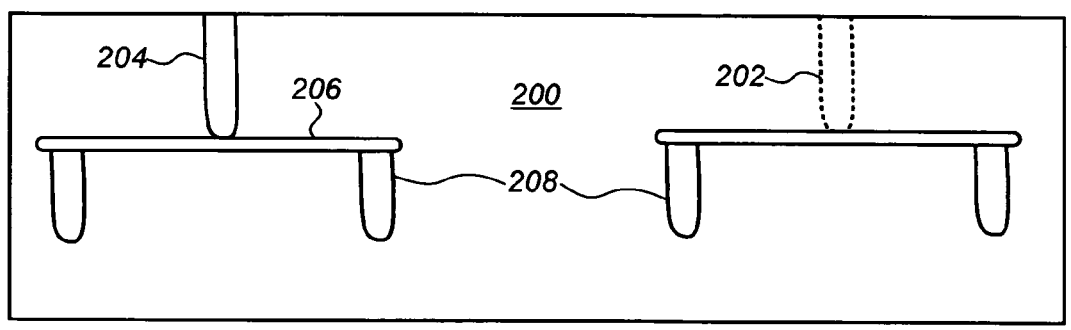
FIG. 2 (Prior Art) is a diagram illustrating an electron microscope image of a cross-sectional view of a semiconductor topography prepared according to a conventional method showing an unfilled contact.

The present invention is directed generally to methods of forming contacts in a semiconductor topography and, more particularly, to semiconductor processing methods for cleaning contact openings post contact-etch that reduce contact defects and substantially eliminate unfilled contacts.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "one embodiment" in various places in the specification do not necessarily all refer to the same embodiment.

Generally, the method of the present invention involves a high temperature purge following a dry clean process to remove residues left by the etch and/or the dry clean process. Preferably, the purge or residue removal process is performed in-situ in the same process chamber as the dry clean step, and immediately following the dry clean process. More preferably, plasma is generated upstream of the process chamber using a microwave generator and a process gas including one or more gases selected from the group consisting of Nitrogen ($N_2$), Hydrogen ($H_2$), Argon (Ar) and Helium (He), before it is introduced into the chamber. The cleaning method of the present invention eliminates need for an organic solvent, such as EKC®, as the purpose of such solvents is the removal of the $NF_3/H_2$ salt residues or deposits, thereby reducing contact defects and substantially eliminating unfilled contacts due to galvanic corrosion caused by the solvents.

In one embodiment, the dry clean process includes the step of placing the substrate in a process chamber and generating a plasma therein using a radio-frequency (RF) generator and a process gas comprising nitrogen-trifluoride ($NF_3$) and $H_2$ to remove resist and etch byproducts remaining on the semiconductor topography following etching of contact openings. In one version of this embodiment, the residue removal step uses a process gas comprising $N_2$ and $H_2$, such as a $N_2$ and a $N_2/H_2$ gas mixture. The high temperature purge or residue removal step removes the $NF_3/H_2$ salt residues that form on the substrate and in the contact openings during the dry clean process while the $N_2$ and $N_2H_2$ also help to substantially preventing oxidation of an underlying material or layer. This embodiment is particularly advantageous in recipes or applications where the contact-etch exposes underlying titanium-nitride (TiN), tungsten (W), titanium-tungsten (TiW) or silicon layers.

Figure 3:
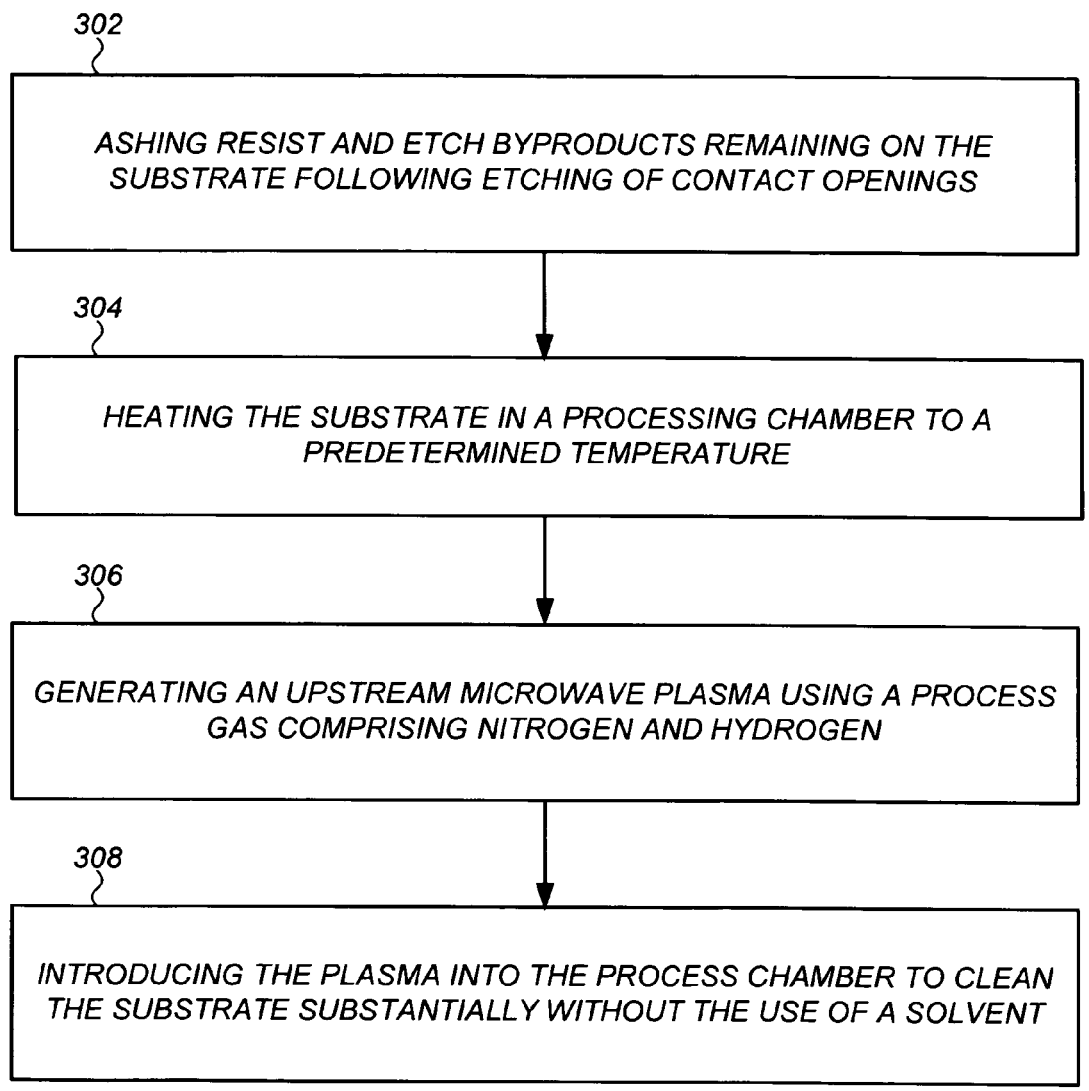
FIG. 3 is a flowchart of a method of performing a post contact-etch clean according to an embodiment of the present invention.

The method of the present invention will now be described in greater detail with reference to FIG. 3 and Table I, shown below. FIG. 3 is a flowchart of a method for performing a post contact-etch clean, a recipe and a process flow for which are shown in Table I.

TABLE I

| Process Parameter | Dry Clean | | Residue Removal |
|---|---|---|---|
| Pins (Up/Down) | Down | Down | Up |
| Platen Temp. (° C.) | 40 | 40 | 40 |
| Wafer Temp. (° C.) | 40 | 40 | 270 |
| O2 (sccm) | 400 | — | — |
| N2H2 (sccm) | — | — | 1300 |
| NF3 (sccm) | — | 5 | — |
| H2 (sccm) | — | 300 | — |
| N2 (sccm) | — | 400 | 900 |
| Pressure (mTorr) | 400 | 750 | 1500 |
| RF (W) | 420 | 400 | — |
| MW (W) | — | — | 1500 |
| Step Time (Sec) | 75 | 15 | 30 |

Generally, the residue removal process of the present invention immediately follows a dry clean process, and is also performed in a processing or dry clean chamber.

A suitable dry clean chamber includes, for example, an Iridia® tool, commercially available from Novellus Systems, Inc., of San Jose, Calif. The dry clean process and the residue removal process may be carried out in separate chambers. However, as noted above, to realize the full savings in processing time afforded by the present invention, and decrease the possibility of further contamination or oxidation, preferably, the residue removal process is performed in-situ in the same process chamber as the dry clean step.

Referring to FIG. 3, the process begins with dry cleaning or removing resist and etch-byproducts remaining on the substrate following etching of contact openings (step 302). In the embodiment of the recipe or process flow shown in Table I, the dry clean step, step 302, comprises two sub-steps including a first ashing step in oxygen plasma generated using a RF generator, followed by a second dry clean step in RF plasma containing $NF_3$ and $H_2$.

Referring to Table I, the ashing step can include, for example, flowing an oxygen-containing gas, such as oxygen ($O_2$) at about 400 standard cubic centimeters per minute (sccm), while maintaining a chamber pressure of about 400 mTorr, and applying an RF power of about 420 Watts (W) for a time of about 75 seconds. Preferably, the substrate undergoing cleaning is held in thermal contact with a chuck or platen, which is cooled to maintain a substrate temperature of about 40° C.

Generally, as in the recipe or process flow shown in Table I, the ashing step is followed by a second dry cleaning step in which a dry cleaning process gas including, for example, $NF_3$ and $H_2$ remove any resist and etch byproducts remaining on the semiconductor topography following the ashing step. Preferably, the second dry cleaning step immediately follows the ashing step and is performed in-situ in the same chamber as that used to perform the ashing step. In the embodiment shown, $NF_3$ is flowed at about 5 sccm and $H_2$ at about 300 sccm. Additionally, or optionally the process gas may further include an inert carrier gas, such as $N_2$ at a rate suitable to maintain a desired chamber pressure. In recipe shown in Table I $N_2$ is flowed at a rate of about 400 sccm to maintain a chamber pressure of about 750 mTorr. An RF power of about 400 W is applied to the process gas in the chamber to generate plasma to which the substrate is exposed for a time of about 15 seconds. Again, the substrate undergoing cleaning is preferably held in thermal contact with the chuck or platen, which is cooled to maintain a substrate temperature of about 40° C.

Although the dry cleaning step, and in particular the ashing and dry cleaning sub-steps thereof, have been described above in some detail with respect to certain embodiments thereof, it will be appreciated by those skilled in the art that these embodiments are exemplary only. It will further be appreciated that other dry cleaning steps and methods may be used prior to the high temperature purge or residue removal process of the present invention and it is not to be construed as being limited thereby.

In accordance with a preferred embodiment of the present invention, the residue removal process immediately follows the second dry cleaning step and is performed in-situ in the same chamber. The residue removal process begins by heating the substrate in a processing chamber to a predetermined high temperature (304). Heating the substrate may be accomplished, for example, by first raising pins to lift the substrate from thermal contact with the platen, which may or may not be cooled to maintain a platen temperature of about 40° C., as shown in Table I. The substrate may then be heated to the desired temperature using, for example, radiant heaters such as heat lamps. Alternatively, the substrate may be heated to the desired temperature by the exposure to the heated process gas or plasma. Preferably, the substrate is heated to a temperature sufficiently high to remove the $NF_3/H_2$ salt residues that form on the substrate and in the contact openings during the dry clean process. More preferably, the substrate is heated to a temperature of between 120° C. and 400° C., and most preferably to a temperature of at least about 270° C.

Next, an upstream microwave plasma is generated using a process gas including one or more gases selected from the group consisting of nitrogen, hydrogen, argon and helium (step 306) and introduced into process chamber to clean the substrate substantially without the use of an organic solvent (step 308). In the recipe or process flow shown in Table I, the process gas includes an $N_2/H_2$ gas mixture plus an $N_2$ gas flowed at about 1300 sccm and about 900 sccm respectively, to maintain a desired chamber pressure of about 1500 mTorr. A microwave power of about 1500 W is applied to the process gas upstream of the chamber to generate plasma to which the substrate is exposed for a time of about 30 seconds.

Optionally, the substrate can be removed from the process chamber following the residue removal step (step 308) and an additional wet clean performed using aqueous chemicals to remove any remaining residues, which are rendered water-soluble by the residue removal process of the present invention. The wet clean can be performed in, for example, a Semitool® Scepter™ rinser, available from Semitool, Inc., of Kalispel, Mont.

Figure 4:
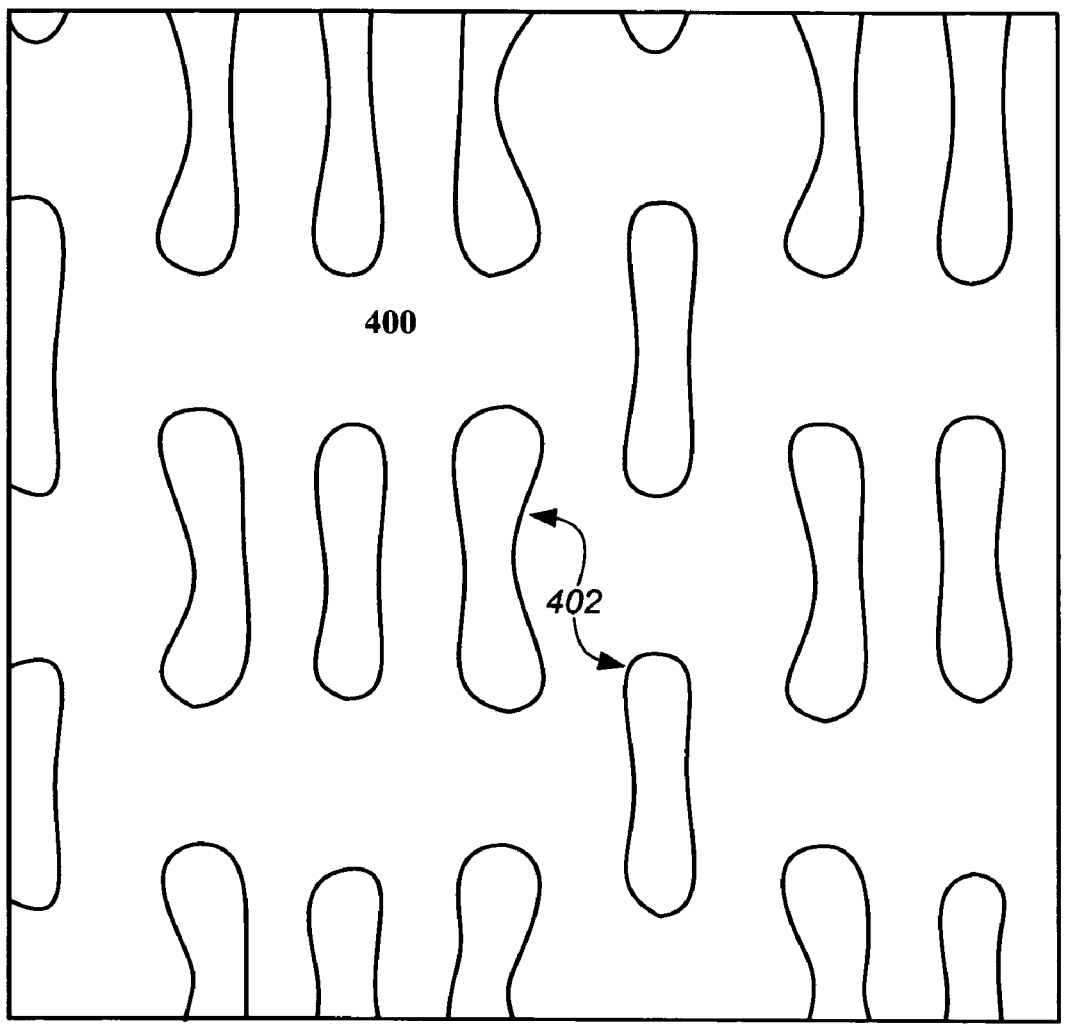
FIG. 4 is a diagram illustrating an electron microscope image of a planar top view of contact openings in a semiconductor topography following a post contact etch clean according to an embodiment of the method of the present invention.

A diagram illustrating an electron microscope image of a planar top view of contact openings 402 in a semiconductor topography formed on a substrate 400 following a post contact etch clean according to an embodiment of the method of the present invention is shown in FIG. 4. Comparing the diagram of FIG. 4 to that of FIG. 1 described previously it will be noted there is substantially no ash residue remaining in the contact openings 402 following the cleaning process of the present invention, thereby eliminating the need for an organic solvent, such as EKC®, and reducing contact defects and substantially eliminating unfilled contacts due to galvanic corrosion caused by the use of such solvents.

It has been found that the inventive cleaning process improves overall yield, that is both a virgin yield or the yield of substrate or die the first time through the clean process, and yield of repairable die, which may be being reworked for any one of a number of reasons, by at least about 5%. The cleaning process improves virgin yield by at least about 25%.

Figure 5A:
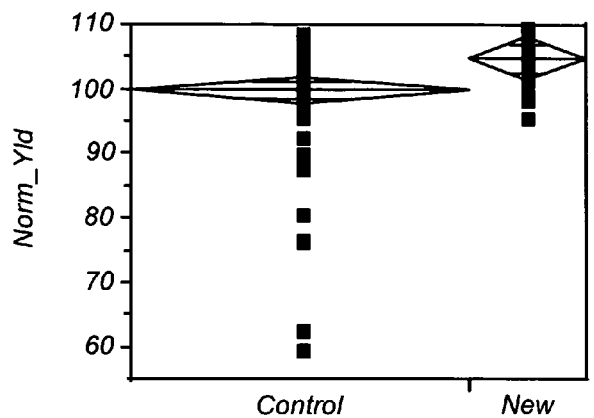
FIGS. 5A-5C are graphs illustrating the improvement in yield for a memory device processed using the cleaning process of the present invention as compared to a control group processed using a conventional cleaning process including an organic solvent.
Figure 5B:
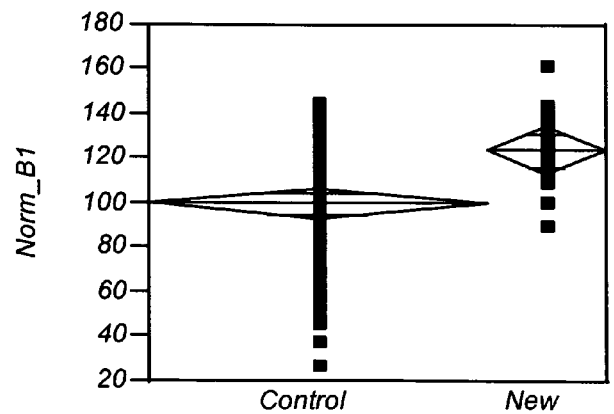
Figure 5C:
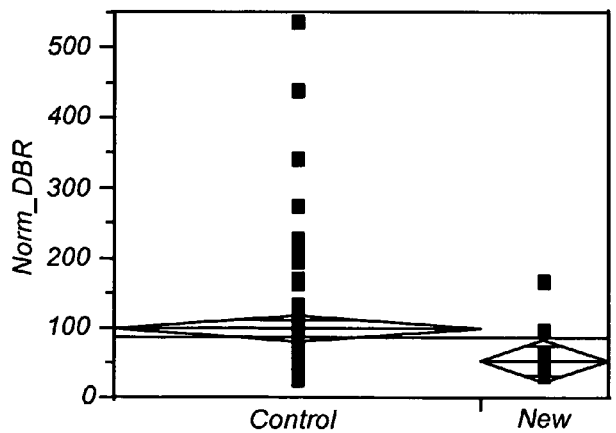

Further evidence of the improvement in yield realized through the reduction in contact failures by the cleaning process of the present invention is illustrated in FIGS. 5A to 5C. In particular, the graphs illustrate the improvement in yield for a memory device processed using the cleaning process of the present invention as compared to a control group processed using a conventional cleaning process including an organic solvent. The graphs show a comparison of normalized overall yield for lots or batches of substrates each having a number of memory devices formed thereon. The "control" data referred is based on 60 lots processed using a conventional cleaning process including an organic solvent. The "new" data is based on 25 lots processed using the cleaning process of the present invention.

FIG. 5A shows the normalized overall yield using a one way analysis of variance (ANOVA) test to compare the means for the different cleaning process and used to assess the effectiveness of the cleaning process of the present invention. Referring to FIG. 5A, it is seen that the control group has a normalized mean yield of 100.000 with a standard error of 0.9992, a lower $95^{th}$ percentile of 98.02, and an upper $95^{th}$ percentile of 101.98. By comparison, the new group has a normalized yield of 104.819 with a standard error of 1.66958, a lower $95^{th}$ percentile of 101.45, and an upper $95^{th}$ percentile of 108.19 for an improvement in overall yield of up to about 8%.

FIG. 5B shows the normalized bin1 or virgin die yield using a one-way ANOVA test. Referring to FIG. 5B, it is seen that the control group has a normalized mean yield of 100.000 with a standard error of 3.2222, a lower $95^{th}$ percentile of 93.06, and an upper $95^{th}$ percentile of 106.40. By comparison, the new group has a normalized yield of 124.259 with a standard error of 5.4683, a lower $95^{th}$ percentile of 113.40, and an upper $95^{th}$ percentile of 135.12 for an improvement in virgin yield of up to about 25%.

Finally, FIG. 5C shows the normalized die loss due to double bits in a row (DBR) failure of the memory devices using a one-way ANOVA test. Referring to FIG. 5C, it is seen that the control group has a normalized mean of 100.000 with a standard error of 9.098 a lower $95^{th}$ percentile of 81.938, and an upper $95^{th}$ percentile of 118.06. By comparison, the new group has a DBR failure of 54.336 with a standard error of 15.440, a lower $95^{th}$ percentile of 23.684, and an upper $95^{th}$ percentile of 84.99.

The advantages of the post contact-etch clean of the present invention over previous or conventional methods include: (i) improved yield and reduction in contact defects including the substantial elimination of unfilled contacts due to galvanic corrosion; (ii) reduced fabrication time due to elimination of the solvent strip step; and (iii) cost savings due to elimination of the need for solvent strip chemicals.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A method comprising steps of:
dry cleaning a substrate in a plasma to remove resist and etch byproducts remaining after etching of one or more contact openings through a dielectric layer formed on a surface of the substrate, wherein the dry clean step comprises the step of placing the substrate in a process chamber and generating plasma therein using a radio-frequency (RF) generator and an oxygen-containing gas;
heating the substrate in a processing chamber to a predetermined temperature;
generating a plasma upstream of the process chamber using a microwave generator and a process gas; and
introducing the plasma into the process chamber to remove residue from the substrate left by the dry cleaning step substantially without the use of an organic solvent,
whereby galvanic corrosion of contacts subsequently formed in the contact openings is substantially eliminated.

2. A method according to claim 1, wherein the dry clean step further comprises the step of exposing the substrate to plasma generated using the RF generator and a process gas comprising nitrogen-trifluoride ($NF_3$) and $H_2$.

3. A method according to claim 1, wherein the dry clean step and the residue removal step are performed sequentially in the same process chamber.

4. A method according to claim 3, further comprising an aqueous wet clean step.

5. A method according to claim 3, wherein the dielectric layer is formed on a silicon layer on the substrate.

6. A method according to claim 3, wherein the dielectric layer is formed on a titanium-nitride (TiN), tungsten (W), or titanium-tungsten (TiW) layer on the substrate.

7. A method according to claim 1, wherein the step of heating the substrate to a predetermined temperature comprises the step of heating the substrate to a temperature between 120° C. and 400° C.

8. A method according to claim 1, wherein the step of generating a plasma upstream of the process chamber comprises the step of generating a plasma using a process gas comprising one or more gases selected from the group consisting of Nitrogen ($N_2$), Hydrogen ($H_2$), Argon and Helium.

9. A method according to claim 1, wherein the step of generating plasma upstream of the process chamber comprises the step of generating plasma using a process gas comprising $N_2$ and $H_2$.

10. A method comprising:
   ashing in an oxygen plasma resist remaining on a substrate after etching of one or more contact openings through a dielectric layer formed on a surface of the substrate;
   removing resist and etch byproducts remaining on the substrate after ashing in a plasma generated using a radio-frequency (RF) generator and a process gas comprising nitrogen-trifluoride ($NF_3$) and hydrogen ($H_2$); and
   removing residue from the substrate left by the removal of the resist and etch byproducts, by heating the substrate in a process chamber, and exposing the surface thereof to a plasma generated upstream of the process chamber using a microwave generator and a process gas comprising nitrogen ($N_2$) and $H_2$.

11. A method according to claim 10, wherein the ashing, removing resist and etch byproducts and removing the residue are performed sequentially in the same process chamber.

12. A method according to claim 10, further comprising an aqueous wet clean following removing residue.

13. A method according to claim 10, wherein the plasma generated upstream of the process chamber is generated using a process gas further comprising argon or helium.

* * * * *